(12) United States Patent
Schulz-Harder (10) Patent No.: US 8,683,682 B2
(45) Date of Patent: Apr. 1, 2014

(54) METHOD FOR THE PRODUCTION OF A METAL-CERAMIC SUBSTRATE

(75) Inventor: Jurgen Schulz-Harder, Lauf (DE)

(73) Assignee: Curamik Electronics GmbH, Eschenbach (DE)

( * ) Notice: Subject to any disclaimer, the term of this patent is extended or adjusted under 35 U.S.C. 154(b) by 1285 days.

(21) Appl. No.: 11/631,639

(22) PCT Filed: Apr. 23, 2005

(86) PCT No.: PCT/DE2005/000752
§ 371 (c)(1),
(2), (4) Date: Apr. 3, 2009

(87) PCT Pub. No.: WO2006/005281
PCT Pub. Date: Jan. 19, 2006

(65) Prior Publication Data
US 2009/0232972 A1    Sep. 17, 2009

(30) Foreign Application Priority Data

Jul. 8, 2004  (DE) .......................... 10 2004 033 226
Jul. 14, 2004 (DE) .......................... 10 2004 033 933

(51) Int. Cl.
*H05K 3/20*     (2006.01)
*H05K 3/02*     (2006.01)
*H05K 3/10*     (2006.01)

(52) U.S. Cl.
USPC .............................................. 29/831; 29/846

(58) Field of Classification Search
USPC ................ 29/831, 846, 847, 874; 228/122.1; 427/96
See application file for complete search history.

(56) References Cited

U.S. PATENT DOCUMENTS

| | | | | | |
|---|---|---|---|---|---|
| 4,483,810 | A | * | 11/1984 | Bunk et al. .................. | 156/89.16 |
| 4,693,409 | A | * | 9/1987 | Mizunoya et al. ......... | 228/122.1 |
| 4,996,116 | A | * | 2/1991 | Webster et al. ............... | 428/627 |
| 5,082,163 | A | * | 1/1992 | Kanahara et al. .......... | 228/124.1 |
| 5,108,026 | A | * | 4/1992 | Su et al. ..................... | 228/122.1 |
| 5,268,064 | A | * | 12/1993 | Woo et al. ........................ | 216/20 |
| 5,675,181 | A | * | 10/1997 | Nishiura et al. .............. | 257/701 |
| 5,807,626 | A | * | 9/1998 | Naba ............................. | 428/210 |
| 6,074,803 | A | * | 6/2000 | McGrath et al. .............. | 430/311 |
| 7,036,711 | B2 | * | 5/2006 | Schulz-Harder ............... | 228/219 |
| 7,159,757 | B2 | * | 1/2007 | Takahashi et al. .......... | 228/122.1 |
| 7,811,655 | B2 | * | 10/2010 | Schulz-Harder et al. ..... | 428/172 |
| 2012/0107642 | A1 | * | 5/2012 | Meyer et al. .................. | 428/623 |
| 2012/0193324 | A1 | * | 8/2012 | Schulz-Harder ................ | 216/20 |

FOREIGN PATENT DOCUMENTS

| | | | |
|---|---|---|---|
| DE | 2319854 | * | 4/1973 |
| DE | 23 19 854 | | 10/1973 |
| DE | 4210900 | | 10/1993 |
| DE | 3855854 | | 7/1997 |
| JP | 61-225047 | | 10/1986 |
| JP | 10-93244 | | 4/1998 |
| JP | 2000034177 | | 2/2000 |
| JP | 2000150719 | | 5/2000 |
| JP | 2000236052 | | 8/2000 |

\* cited by examiner

*Primary Examiner* — David Angwin
(74) *Attorney, Agent, or Firm* — Welsh Flaxman & Gitler LLC (57) ABSTRACT

Disclosed is a method for producing a metal-ceramic substrate. According to said method, a metal layer is applied to at least one face of a ceramic substrate or a ceramic layer by means of a direct bonding process, and the metal-ceramic substrate or partial substrate is aftertreated in a subsequent step at a gas pressure (aftertreatment pressure) ranging approximately between 400 and 2000 bar and an aftertreatment temperature ranging approximately.

20 Claims, 7 Drawing Sheets

METHOD FOR THE PRODUCTION OF A METAL-CERAMIC SUBSTRATE

BACKGROUND OF THE INVENTION

The invention relates to a method for manufacturing a metal-ceramic substrate in which a metal layer is applied to at least one side of a ceramic substrate using a direct bonding process.

Metal-ceramic substrates, in particular copper-ceramic substrates, are used increasingly as a base substrate or printed circuit board in power modules designed for higher operating voltages, e.g. for operating voltages of 600 V and higher. One of the requirements of such power modules is a sufficiently high partial discharge resistance. This requirement corresponds to the knowledge that partial discharges, which occur during operation of such a module over an extended period, cause electrically conductive paths in the isolating areas of the module, which can weaken the isolation and eventually also cause extreme voltage punctures, resulting in the failure of the respective module.

The requirement for the highest possible partial discharge resistance applies to the entire module, i.e. each individual component of the module must fulfill the requirement for the highest possible partial discharge resistance. Since the respective metal-ceramic substrate is an essential component of the respective module, this requirement also applies to this substrate, although partial discharges that occur only within the metal-ceramic substrate cause no damage to the isolating effect there. The reason for the requirement for each individual component to have the necessary partial discharge resistance is, for example, that it cannot be determined by measurements of the finished module which individual component of the module is responsible for partial discharges in the module.

The measurement of the partial discharge resistance is defined in standard IEC 1278. According to this measuring principle, the respective test piece is first subjected in a first measuring or test phase to an isolation voltage that is considerably higher than the operating voltage and then, in a second measuring or test phase, is first subjected to a reduced, preparatory measuring voltage and finally to the actual measuring or test voltage, at which the partial discharge is then measured. The preparatory test voltage is then above the maximum operating voltage of the respective module and the actual test voltage is below the maximum operating voltage of the module. The partial discharge may not exceed a value of 10 pico Coulomb (pC) in this measurement.

In the production of metal-ceramic substrates, a method is known for manufacturing the metallization required for strip conductors, connectors, etc. on a ceramic, e.g. on an aluminum-oxide ceramic, by means of the "direct bonding" process or for metallization made of copper by means of "DCB" (Direct Copper Bonding) technology, the metallization being formed from metal or copper sheets, the surfaces of which comprise a layer or a coat (hot-melt layer) resulting from a chemical bond between the metal and a reactive gas, preferably oxygen.

In this method, which is described for example in US-PS 37 44 120 and in DE-PS 23 19 854, this layer or coating (hot-melt layer) forms a eutectic with a melting temperature below the melting temperature of the metal (e.g. copper), so that the layers can be bonded to each other by placing the foil on the ceramic and heating all layers, namely by melting the metal or copper essentially only in the area of the hot-melt layer or oxide layer.

The DCB process then comprises, for example, the following process steps:
 oxidation of a copper foil so as to produce an even copper oxide layer;
 placing the copper foil on the ceramic layer;
 heating the composite to a process temperature between approx. 1025 and 1083° C., e.g. to approx. 1071° C.;
 cooling to room temperature.

One disadvantage of the DCB technology is that the process causes defective spots to occur between the respective metallization (copper) and the ceramic. Although these defective spots hardly affect the thermal properties of a metal-ceramic substrate manufactured using the DCB technology, since the bond, i.e. the surface area of the bond between the ceramic and the metal with no defective spots in relation to the total surface of the transition between the metal and the ceramic is generally greater than 90%, a certain problem results from the defective spots with respect to the partial discharge resistance.

The process-related disadvantages of the DCB technology can be eliminated for example by use of the active soldering process. The disadvantage of this process, however, is that it requires a relatively expensive solder and that a complex, multi-stage process is required for structuring the metal layers applied to the ceramic, in order to remove all of the electrically conductive material (including solder) between adjacent conductor strips, contact surfaces, etc., or that the metal layer forming the respective metallization must be structured before bonding to the ceramic layer or the ceramic substrate.

It is an object of the invention is to present a method that eliminates or at least reduces defective spots despite the use of the DCB process, so that a negative effect on the properties of the metal-ceramic substrate and in particular on the partial discharge resistance can no longer be determined.

SUMMARY OF THE INVENTION

In the method according to the invention, a bond of more than 95% between the metallization or metal layers and the ceramic is achieved. In any event, defective spots with a diameter greater than 50 µm are eliminated. Surprisingly, the ceramic is not damaged by the post-treatment.

"Ceramic substrate" according to the invention is generally understood to be a ceramic layer. "Metal-ceramic substrate" according to the invention refers generally to a substrate or a sequence of layers comprising at least one ceramic layer and at least one metallization provided on at least one surface side of the ceramic layer. "Bond" according to the present invention is the surface area of the transition between the respective metallization and the ceramic layer, which (surface area) does not exhibit defective spots and on which therefore a direct bond of the metal layer to the ceramic exists.

The post-treatment according to the invention takes place by use of an inert gas as a pressure gas with an oxygen content or oxygen partial pressure that is adjusted based on the post-treatment temperature so that the oxygen partial pressure is greater than the partial pressure at which a breakdown of the bond border between the copper and the ceramic and therefore a detachment of the respective DCB bond between the copper and the ceramic could occur. The oxygen partial pressure is limited upwardly, however, so that no appreciable oxidation of the copper occurs during the post-treatment. Since the oxidation rate decreases with a decreasing post-treatment temperature, the selected oxygen partial pressure can be accordingly somewhat higher at lower post-treatment temperatures.

BRIEF DESCRIPTION OF THE DRAWINGS

The invention is explained below in more detail based on exemplary embodiments with reference to the drawings, wherein.

DETAILED DESCRIPTION OF THE INVENTION

Figure 1:
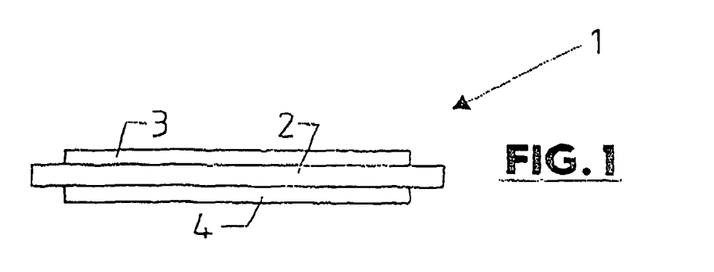
FIG. 1 shows a simplified representation of a metal-ceramic substrate according to the invention.

FIG. 1 shows a simplified cross-section view of a copper-ceramic substrate 1 consisting of the ceramic layer 2 and the metal layers 3 and 4, each of which is formed from foils made of copper or copper alloy and bonded to the ceramic layer 2 by means of the DCB process. The substrate 1 is for example the base substrate or the printed circuit board of a power module for high operating voltages (above 600 volts). At least one of the two metal layers 3 and 4 is then structured using a known technology, for example etch-masking technology, namely for forming contact surfaces, strip conductors, etc. for the passive and/or active components forming the module to be provided on the substrate 1.

Figure 2:
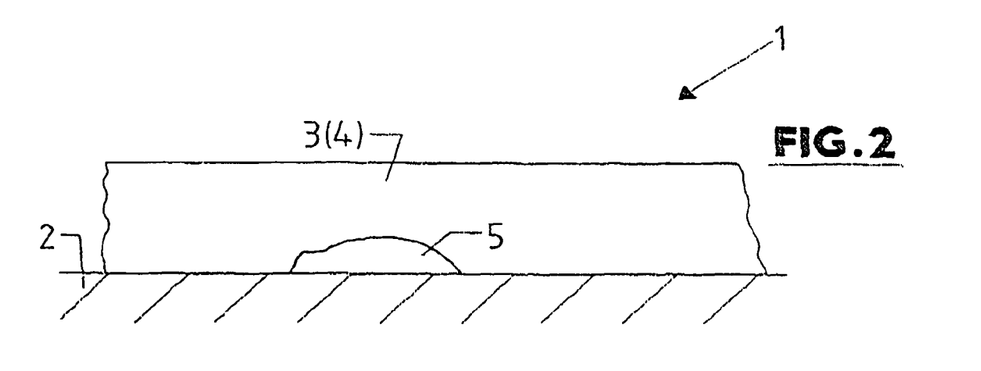
FIG. 2 shows an enlarged representation of the transition between the ceramic layer and one metallization for a metal-ceramic substrate before the post-treatment.

FIG. 2 shows the transition between one metal layer 3 or 4 and the ceramic layer after the DCB process, in this case with a defective spot 5.

In order to achieve the required high partial discharge resistance, the substrate 1, after application of the metal layers 3 and 4, is heated in a further process step to a temperature below the process temperature of the DCB process, for example to a temperature between 450 and 1060° C., and simultaneously subjected to a gas pressure between 400 and 2000 bar using a non-reactive gas or inert gas, e.g. argon or nitrogen. This post-treatment (HIP post-treatment), in which the ceramic layer 2 is not damaged, completely or almost completely eliminates hollow spaces or defective spots 5, which may form at the transition between the ceramic layer and the respective metal layer 3 or 4 through the DCB process and thus reduce the partial discharge resistance, so that the substrate 1, despite its construction as a DCB substrate, completely fulfills the requirements for partial discharge resistance.

In the following, various possibilities for manufacturing the metal-ceramic substrate 1 are explained based on examples.

EXAMPLE 1

Figure 3:
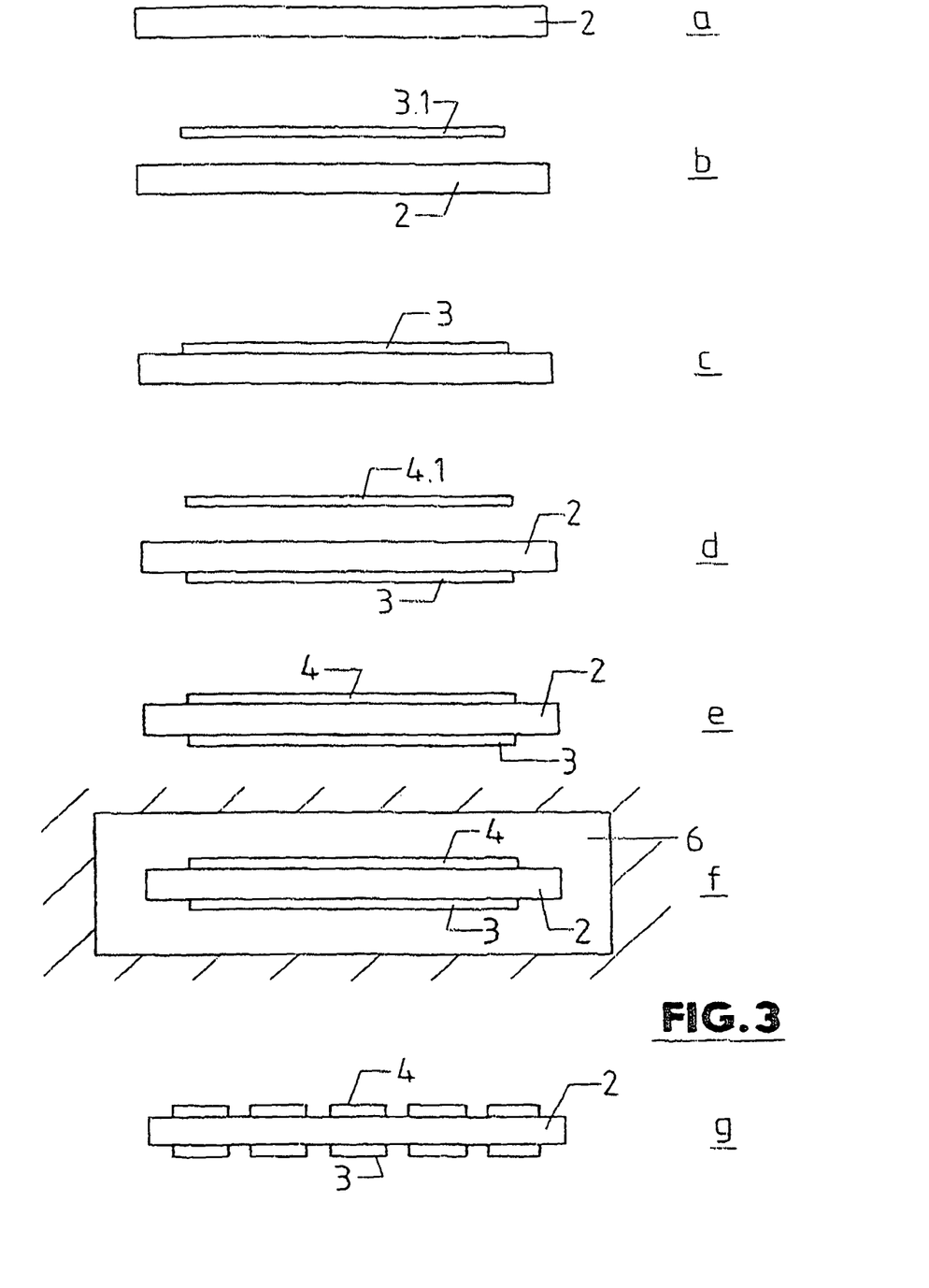
FIG. 3-6 each show various positions of the processing steps of various methods for manufacturing the metal-ceramic substrate of FIG. 1.

In this process, the process steps of which are indicated in FIG. 3 by the positions a-g, a ceramic layer 2 made of $Al_2O_3$ is used, with outer dimensions of 130×180 mm and a thickness of 0.38 mm (position a).

First, a blank 3.1 made of a pre-oxidized copper foil forming the later metal layer 3 is placed onto the ceramic layer 2 (position b) and the array consisting of the ceramic layer 2 and the blank 3.1 is then heated and pre-sintered for approximately 10 minutes in a suitable furnace without oxygen. The array consisting of the ceramic layer 2 and the blank 3.1 is then heated to ca. 1072° C. at an oxygen content of <20 ppm, so that after cooling, the blank 3.1 forms the metal layer 3 (position c) bonded to the one surface side of the ceramic layer through the DCB process.

After flipping the ceramic layer 2, a blank 4.2 made of the pre-oxidized copper foil is likewise applied to the other surface side of the ceramic layer (position d) and the array consisting of the ceramic layer 2, the metal layer 3 and the blank 4.1 is again heated for approximately 10 minutes without oxygen, again at a temperature considerably below the process temperature of approximately 1072° C. of the DCB process. In a further process step the blank 4.1 is then bonded to the ceramic layer 2, through heating to the DCB process temperature at an oxygen content of <20 ppm (position e). After cooling below the DCB process temperature the substrate then features the metallization 4 bonded to the ceramic layer 2.

To eliminate the defective spots 5, the substrate 1 then undergoes post-treatment in a further process step through heating and pressurizing, namely in a closed pressure chamber 6 in a protective gas atmosphere, for example in an argon atmosphere with an oxygen partial pressure of approximately 6 ppm, through heating to a temperature of approximately 560° C. and at a pressure of approximately 1100 bar (position f). Following this treatment the substrate 1 is cooled to room temperature and the metal layers 3 and 4 are structured by means of etch-masking, so that the metal structures form multiple single substrates on the ceramic layer 2, i.e. a plurality of single substrates is formed in the multiple printed panel on the common ceramic layer 2 (position g). By means of laser scribing using a suitable laser, for example a CO2 laser, break-off lines are created on one surface side of the ceramic layer 2 between the structured metal surfaces of the single substrates, so that the multiple substrate can then be broken into the single substrates.

This process results in substrates with a high bond between the metallizations 3 and 4 to the ceramic, i.e. with a bond of at least 95% and with defective spots 5 that have a diameter in the plane of the transition between the ceramic layer 2 and the metallization 3 and 4 that is considerably less then 50 μm.

This process can also be modified, for example in the form that the process steps a-d are combined, i.e. the blanks 3.1 and 4.1 made of the pre-oxidized copper foil are positioned on both sides of the ceramic layer 2 and the array is heated and pre-sintered in a suitable furnace without oxygen, after which the two blanks 3.1 and 4.1 are then bonded to the ceramic layer 2 using the DCB process, at an oxygen content <20 ppm and a temperature of ca. 1072° C.

Furthermore, it is possible to forego the pre-sintering of the blanks 3.1 and 4.1.

EXAMPLE 2

Figure 4:
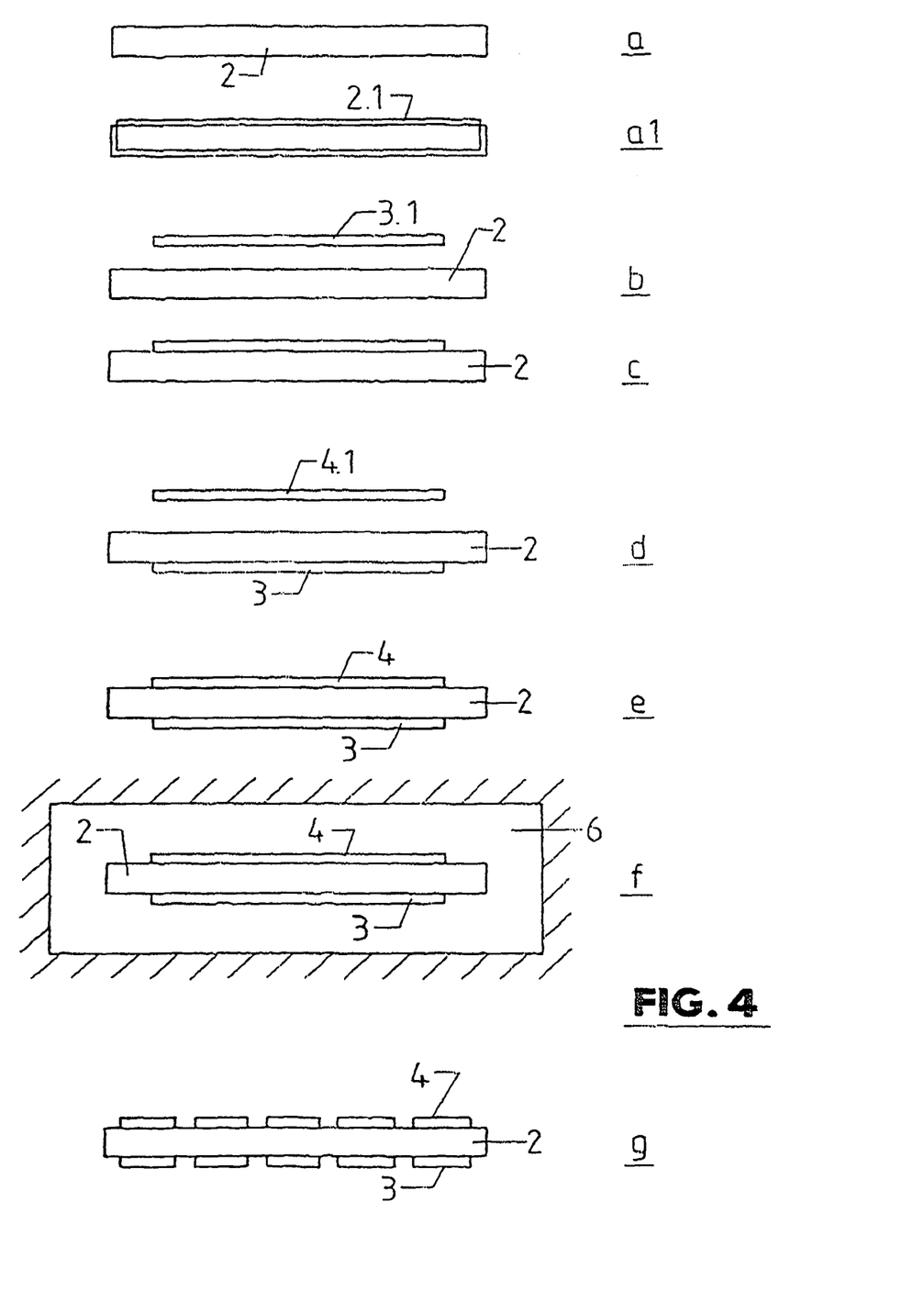

The process steps of this process are indicated in FIG. 4. The starting material is an AlN ceramic layer 2 with the dimensions 130×180 mm and a thickness of 2 mm (position a).

The ceramic layer 2 is provided with a thin layer 2.1 made of $Al_2O_3$, namely by oxidation or treatment for a duration of 30 minutes at a temperature of 1220° C. in an atmosphere containing nitrogen ($N_2$) and oxygen ($O_2$), in which the ratio of nitrogen to oxygen is 80/20 (position a1).

This is followed by the process steps b-g described above in connection with Example 1, although the heat/pressure post-treatment in this embodiment takes place at a temperature of approximately 950° C. and a pressure of approximately 900 bar.

The result of this process is again a substrate 1 with a bond of the metal layers 3 and 4 greater than 95% and without defective spots having a diameter greater than 50 µm.

EXAMPLE 3

Figure 5:
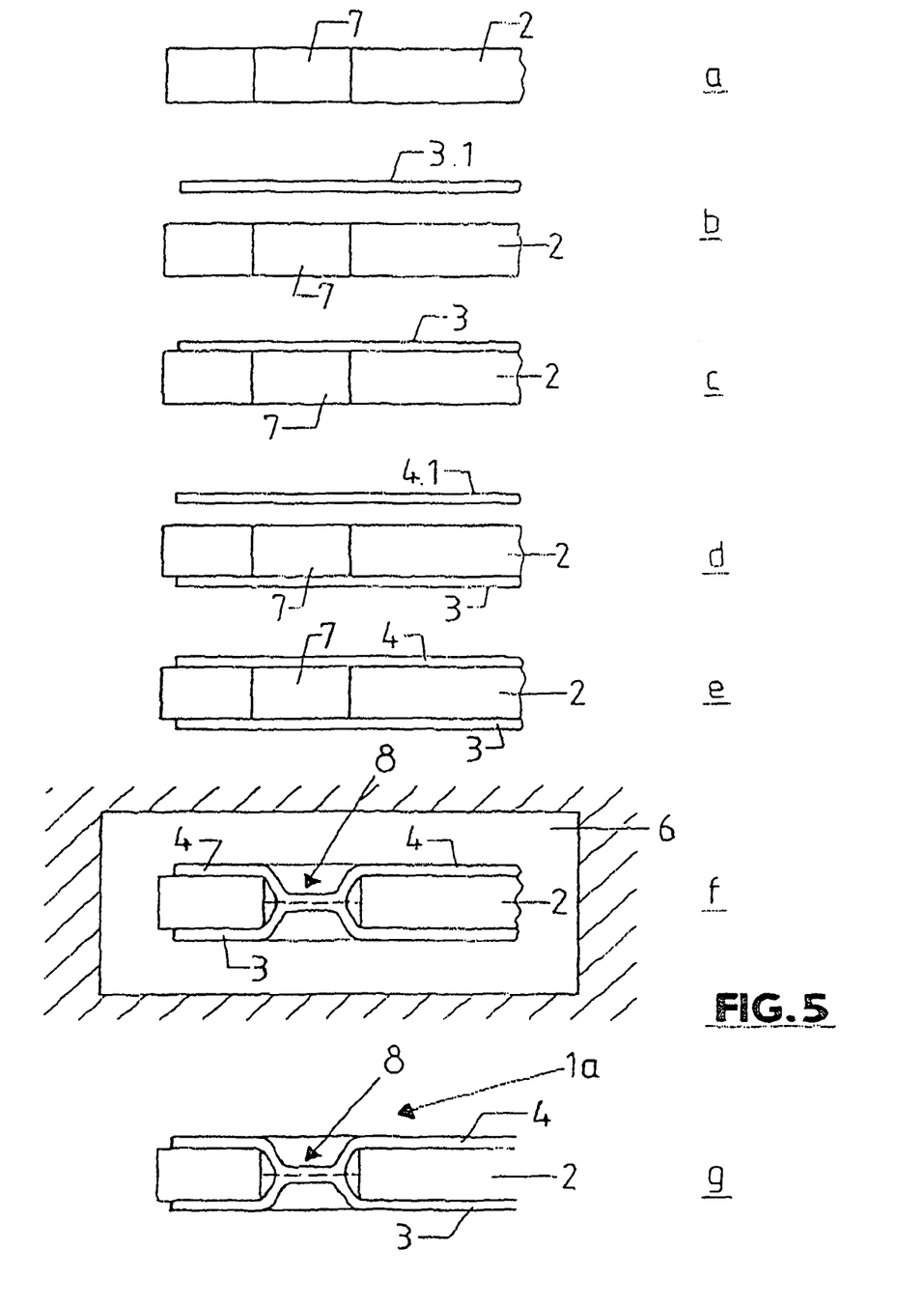

In this process, the process steps of which are indicated in FIG. 5, an $Al_2O_3$ ceramic layer 2 with the dimensions 130×180 mm and a thickness of 0.63 mm is used. Holes 7 are made in the ceramic layer 2 by suitable means, for example by drilling; for the sake of clarity only one such hole is shown (position a). Afterwards, the process steps b-e explained in Example 1 are followed by the application of the metal layers 3 and 4 to the ceramic layer 2.

In the ensuing post-treatment at a temperature of approximately 800° C. and a pressure of 1000 bar (position f), not only are the defective spots 5 eliminated, but also the metal layers 3 and 4 are formed into the holes 7 and the metal layers are thus bonded within the hole 7, so that multiple through-hole contacts 8 are maintained. The post-treatment is then again followed by the structuring of the metallizations 3 and 4, the scribing of the ceramic by means of a laser and the separation of the single substrates by breaking along the break-off lines.

The result is then a substrate 1a, which not only features the high bond of the copper layers 3 and 4, but also the through-hole contact 7 (position g).

EXAMPLE 4

Figure 6:
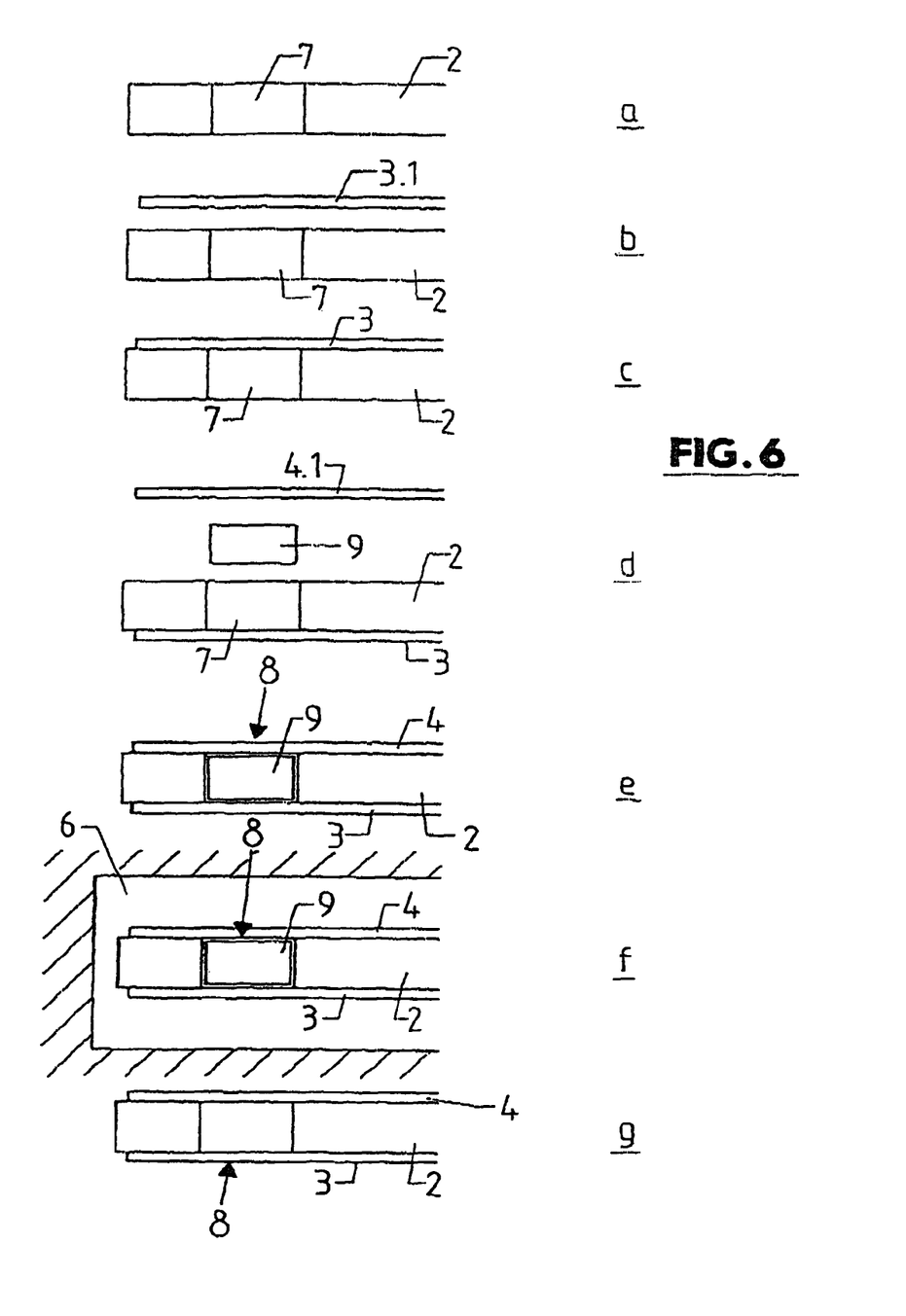

This example relates to a process that differs from the process in Example 3 in that, corresponding to FIG. 6, after the process step d, one disk 8 with a diameter of 0.7 mm and an axial length of 0.3 mm, before applying the blank 4.1, is inserted into each hole 6, which has a diameter of 0.8 mm.

This is then again followed by the bonding of the blank 4.1 (position e) and the post-treatment in the closed chamber 6 at a pressure of approximately 850 bar and a temperature of approximately 1030° C. (position f).

After structuring of the metal layers 3 and 4 and after making the break-off lines by laser scribing, the multiple substrate is likewise separated into the single substrates.

EXAMPLE 5

Figure 7:
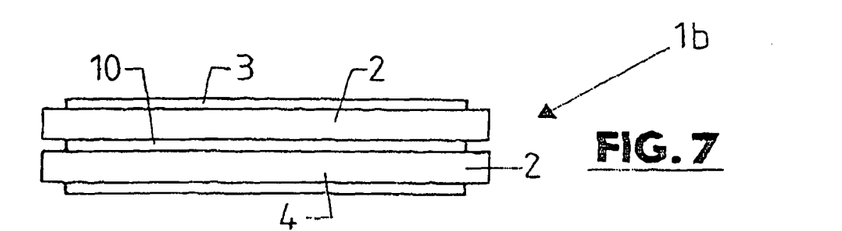
FIG. 7 shows, in a representation similar to FIG. 1, a further embodiment of the metal-ceramic substrate.

FIG. 7 shows as a further possible embodiment a multi-layer substrate 1b, which comprises two ceramic layers 2, one upper and one lower metal layer 3 and 4, both exposed, and one inner metal layer 10 connecting the two ceramic layers 2 with each other. All metal layers 3, 4 and 10 are again formed from a pre-oxidized blank 3.1, 4.1 and 10.1 from a foil made of copper or a copper alloy and have a thickness of approximately 0.3 mm. The substrate 1b is manufactured for example with a process corresponding to FIG. 8, the individual process steps of which are explained in the following example.

Figure 8:
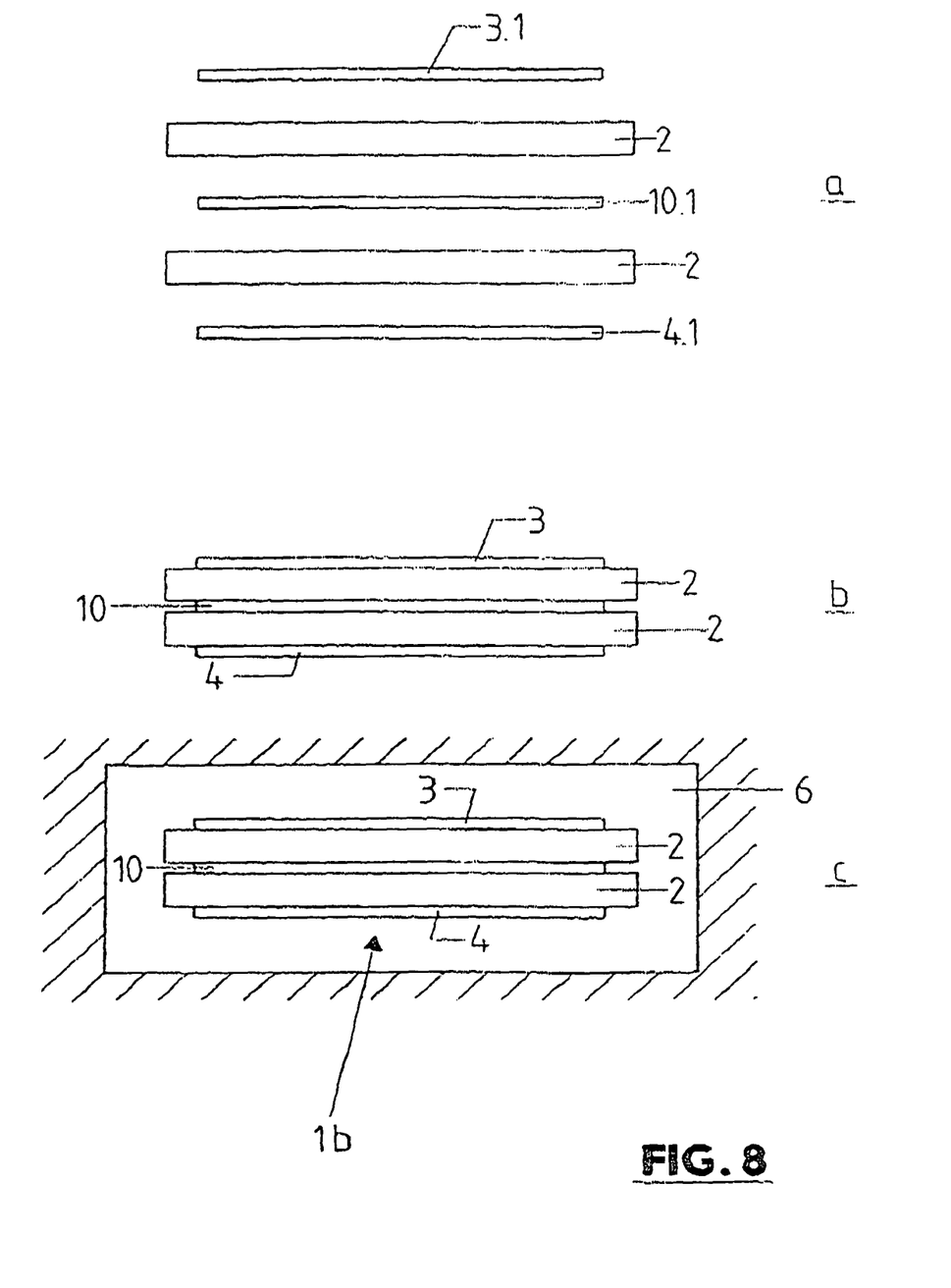
FIG. 8 shows various positions of the processing steps of various methods for manufacturing the metal-ceramic substrate of FIG. 7.

The starting materials for the manufacture of the substrate 1b are two ceramic layers or substrates 2 with the dimensions 60×80 mm and a thickness of 0.38 mm and the three pre-oxidized blanks 3.1, 4.1 and 10.1 from the foil made of copper or copper alloy (position a of FIG. 8). These elements are stacked closely so that they lie one on top of the other and the blank 10.1 is located between the two ceramic layers 2 and the blanks 3.1 and 4.1 lie adjacent to each ceramic layer 2. This is followed by the bonding by means of the DCB process, namely by heating of the stack to the DCB process temperature of ca. 1072° C. in a protective gas atmosphere with an oxygen content of less than 20 ppm. After completion of the DCB process and after cooling, the formation of layers corresponding to the metal-ceramic substrate 1b is already obtained (position b).

The post-treatment then takes place at a pressure of 750 bar and a temperature of 1030° C. (position c).

The result is the substrate 1 in a sandwich construction with a bond of the metal or copper layers 3, 4 and 10 to the surfaces of the ceramic layers 2 greater than 95% and with a defective spot diameter of less than 50 µm.

Figure 9:
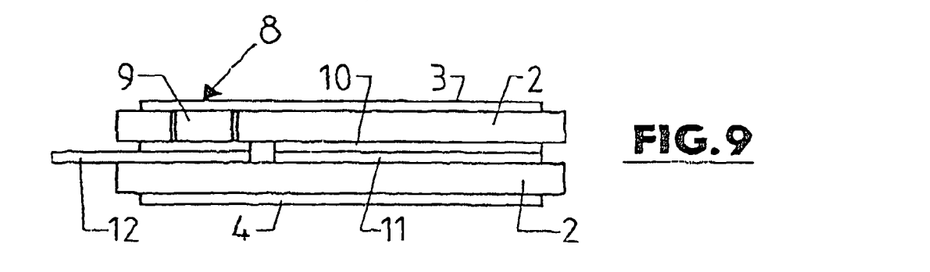
FIG. 9 shows, in a representation similar to FIG. 1, a further embodiment of the metal-ceramic substrate.

FIG. 9 shows a metal-ceramic substrate 1c, which differs from the substrate 1b in that between the metal layer 10 and the bottom ceramic layer 2 a further structured metal layer 11 is provided that projects with at least one section 12 over one side of the substrate 1c, thus forming connections for the module mounted with the metal-ceramic substrate 1c.

The substrate 1c is manufactured for example in process steps described in Example 6 below.

EXAMPLE 6

Figure 10:
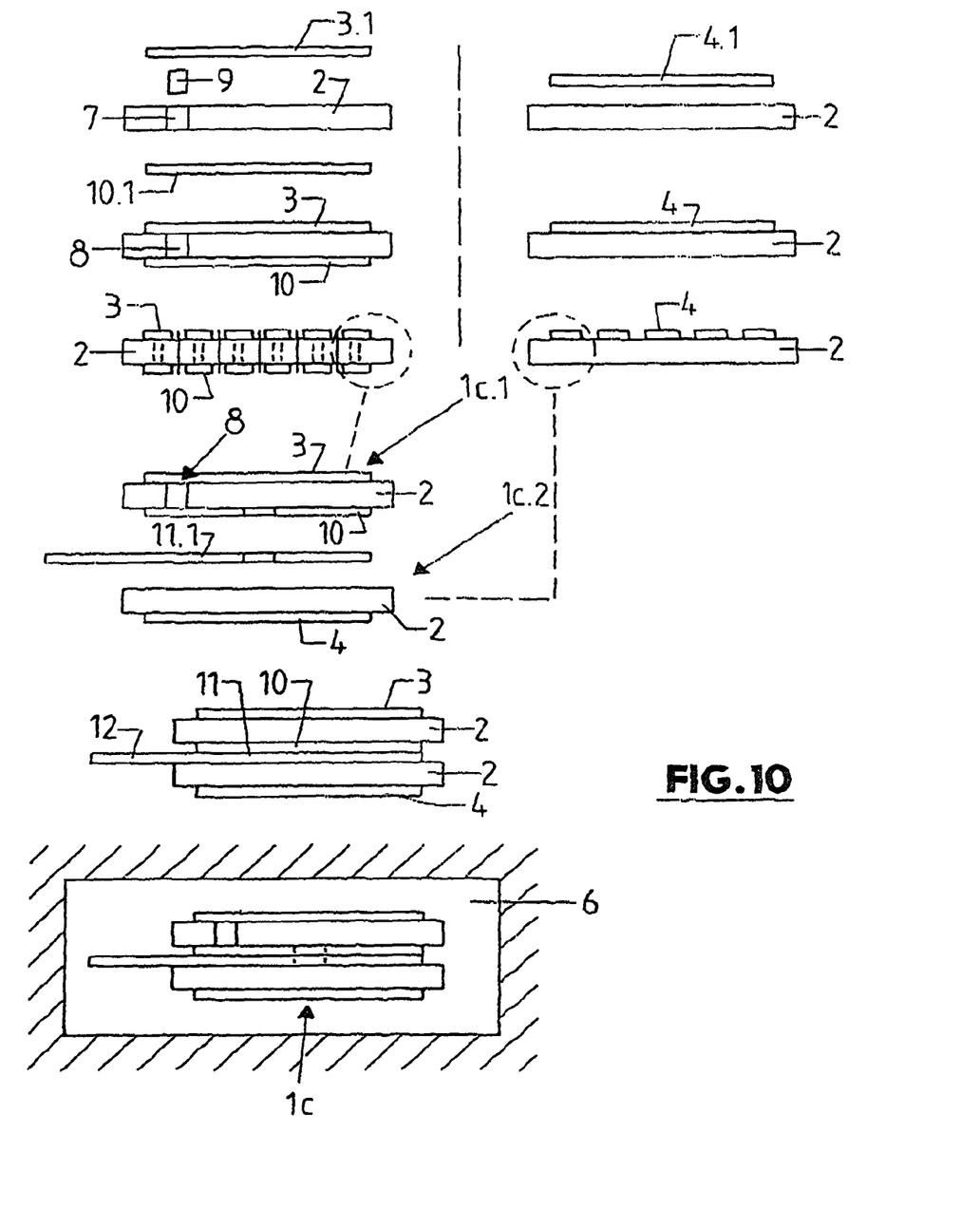
FIG. 10 shows various positions of the processing steps of various methods for manufacturing the metal-ceramic substrate of FIG. 9.

The manufacture of the substrate 1c takes place corresponding to FIG. 10, in that first two single substrates 1c.1 and 1c.2 are manufactured, namely one single substrate 1c.1 consisting of one ceramic layer 2 and the top metal layer 3 and the metal layer 10, and one further substrate 1c.2 consisting of the second ceramic layer 2 and the bottom metal layer 4. Each single substrate is manufactured as a multiple printed panel, i.e. each together with multiple identical single substrates on one common ceramic panel or on one common ceramic substrate 2.

As the starting material for the manufacture of the first sub-substrate, an $Al_2O_3$ substrate with the dimensions 130×180 mm and a thickness of 0.63 mm is used, into which holes 7 are made for the through-hole contact 8 of the metal-ceramic substrates 1c. For the metal layers 3 and 10, pre-oxidized blanks 3.1 and 10.1 made of the copper sheet with the dimensions 129×179 mm and a thickness of 0.3 mm are used. After stacking of the blanks 3.1 and 10.1 and the ceramic layer and insertion of the disk 9 into each hole 7, the metal layers 3 and 10 are bonded to the ceramic layer 2 by heating to the process temperature of ca. 1072° C. and in a protective gas atmosphere with an oxygen content <20 ppm and the through-hole contacts 8 are manufactured via the disks 9. The respective hole 7 has a diameter of approximately 0.9 mm and an axial length or height of 0.6 mm.

After bonding, the metal layers 3 and 10 are structured, for example through etch-masking in the metallizations of the single sub-substrates 1c.1, followed by the laser scribing and the separation of the multiple substrate into these single sub-substrates.

The second sub-substrates 1c.2 consisting of the ceramic layer 2 and the metal layer 4 are manufactured in a similar manner, namely again as a multiple printed panel using a large-format $Al_2O_3$ substrate with the dimensions 130×180 mm and a thickness of 0.63 mm and using a blank 4.1 made of copper foil with the dimensions 129×179 mm and a thickness of 0.63 mm forming the metal layer 4.

For bonding of the two sub-substrates 1c.1 and 1c.2 to the metal-ceramic substrate 1c, a flat punched element 11.1 is placed on the exposed surface side of the ceramic layer 2 of the bottom sub-substrate 1c.2 and then the top sub-substrate with the exposed side of the metal layer 10 is then place on the punched element. The punched element 11.1 is likewise made from a copper foil and is pre-oxidized. In a further DCB process, the bonding of the two sub-substrates 1c.1 and 1c.2 via the punched element 11.1 takes place at the DCB temperature of 1072° C. and in a protective gas atmosphere with an oxygen content of less than 20 ppm. This is followed by the post-treatment, namely at a pressure of 750 bar and a temperature of 1030° C. in a protective gas atmosphere with an oxygen content of approximately 10 ppm.

The result is the metal-ceramic substrate 1c in a sandwich construction with at least one through-hole contact 8 for bonding the metal layer 3 or strip conductors, contact surfaces, etc. formed by said metal layer with external connections 12. The bond of the metal or copper layers in all planes is greater than 95%. Any existing defective spots have a diameter considerably smaller than 50 μm.

The invention was described above based on exemplary embodiments. It goes without saying that numerous modifications and variations are possible without abandoning the underlying inventive idea upon which the invention is based. It is also possible, for example, to combine individual processes or process steps described above.

Reference List
1, 1a, 1c metal-ceramic substrate
1c.1, 1c.2 sub-substrate
2 ceramic layer or ceramic substrate
2.1 layer made of $Al_2O_3$
3, 4 metal layer
3.1, 4.1 blank
5 defective spot
6 closed chamber for post-treatment
7 bore or hole for through-hole contact
8 through-hole contact
9 partial or copper disk
10 metal layer
10.1 blank
11 metal layer
11.1 blank or punched element
12 connection

What is claimed is:

1. A method for manufacturing a metal-ceramic substrate, the method comprising the steps of:
   applying a metal layer to at least one side of a ceramic substrate or a ceramic layer using a direct bonding process at a direct copper bonding temperature between 1025° C. and 1083° C. to form the metal-ceramic substrate, and
   post-treating the metal-ceramic substrate subsequent to applying the metal layer in a processing step at a gas pressure between approximately 400 and 2000 bar and at a post-treatment temperature between approximately 450 and 1060° C.

2. the method according to claim 1, wherein a gas atmosphere of the post-treatment, based on the post-treatment temperature, has an oxygen content or an oxygen partial pressure that is greater than a partial pressure at which a breakdown of a bond border surface between copper and ceramic occurs, but which is limited upward so that no appreciable oxidation of the copper takes place.

3. The method according to claim 2, wherein the oxygen partial pressure at a post-treatment temperature between 900° C. and 1060° C. is between $2\times10^{-7}$ and $1\times10^{-3}$ bar and at a post-treatment temperature between 450° C. and 900° C. is between $3\times10^{-16}$ and $1\times10^{-2}$ bar.

4. The method according to claim 1, wherein a pressure gas for post treatment is an inert gas, argon or nitrogen.

5. The method according to claim 1, wherein a thickness of the at least one ceramic layer is between approximately 0.2 and 4 mm.

6. The method according to claim 1, wherein a thickness of the at least one metal layer is between approximately 0.07 and 1.0 mm.

7. The method according to claim 1, wherein at least one hole is made in at least one ceramic layer for producing at least one through-hole contact, and that metal layers provided on two surface sides of the ceramic layer in the proximity of the hole are formed into the hole and connected with each other during the post-treatment.

8. The method according to claim 1, wherein at least one hole is made in at least one ceramic layer for producing at least one through-hole contact, that an element made of an electrically conductive material, or copper, is inserted into the at least one hole and that during the post-treatment the metal layers provided in the proximity of the at least one hole on two surface sides of the ceramic layer are pressed by means of permanent deformation against the metal element and connected with the latter.

9. The method according to claim 8, wherein a diameter of the metal element is equal to or approximately equal to the diameter of the hole.

10. The method according to claim 8 wherein the metal element has a length perpendicular to the surface sides of the ceramic layer that is equal to or less than the thickness of the ceramic layer.

11. The method according to claim 1, for manufacturing a metal-ceramic substrate in a sandwich construction, wherein at least two ceramic layers are bonded to each other through the direct copper bonding process via at least one metal layer located in between.

12. The method according to claim 1, wherein at least one metal layer is applied to the outside of each ceramic layer using the direct copper bonding process.

13. The method according to claim 1 that for manufacturing a metal-ceramic substrate in a sandwich construction, wherein one first sub-substrate with at least one first ceramic layer and with two metallizations on the two surface sides and one second sub-substrate with at least one ceramic layer and at least one metallization on one surface side of the ceramic layer are manufactured using the direct copper bonding process, that the two sub-substrates are bonded to each other via at least one metal layer in a further direct copper bonding process, and that the post-treatment is carried out in a further process step at the post-treatment pressure and the post-treatment temperature.

14. The method according to claim 13 wherein the at least one metallization is structured after the post-treatment.

15. The method according to claim 14, wherein the metal-ceramic substrate, after structuring of the at least one metallization, is separated into individual substrates, by breaking along break-off lines.

16. The method according to claim 1, wherein the post-treatment temperature is approximately 560° C. and the gas pressure is 1900 bar.

17. The method according to claim 1, wherein the post-treatment temperature is approximately 950° C. and the gas pressure is approximately 900 bar.

18. The method according to claim 1, wherein the post-treatment temperature is approximately 1030° C. and the gas pressure is approximately 850 bar.

19. The method according to claim 1, wherein the post-treatment temperature is approximately 1030° C. and the gas pressure is approximately 750 bar.

20. A method for manufacturing a metal-ceramic substrate, the method comprising the steps of:
   (i) applying a metal layer to at least one side of a ceramic substrate or a ceramic layer using a direct bonding process at a direct copper bonding temperature between 1025° C. and 1083° C. to form the metal-ceramic substrate, and
   (ii) post-treating the metal-ceramic substrate subsequent to applying the metal layer in a processing step at a gas pressure between approximately 400 and 2000 bar and the post-treating is carried out at a post-treatment temperature of at least 50% of the direct copper bonding temperature, that is between 1025° C. and 1083° C.

* * * * *